United States Patent [19]

Pepper

[11] 4,220,918

[45] Sep. 2, 1980

[54] RADIATION HARDNESS TESTING FOR FIELD EFFECT DEVICES

[75] Inventor: Michael Pepper, Cambridge, England

[73] Assignee: Plessey Handel und Investments AG., Zug, Switzerland

[21] Appl. No.: 888,989

[22] Filed: Mar. 22, 1978

[30] Foreign Application Priority Data

Mar. 26, 1977 [GB] United Kingdom ............... 12814/77

[51] Int. Cl.$^2$ ............................................ G01R 31/22
[52] U.S. Cl. ........................... 324/158 T; 324/158 D
[58] Field of Search ............. 324/158 T, 158 D, 73 R; 250/492 A, 370

[56] References Cited

U.S. PATENT DOCUMENTS 4,114,096  9/1978  Chinery ............................ 324/158 T

OTHER PUBLICATIONS

Long, D. M., "Transient Radiation Response . . . ", IEEE Trans. on Nuclear Science, vol. NS-21, Dec. 1974, pp. 119-123.
Johnson et al, "Terminal Measurements for Hardness . . . ", IEEE Trans. on Nuclear Science, vol. NS-22, Dec. 1975, pp. 2303-2307.

*Primary Examiner*—Ernest F. Karlsen
*Attorney, Agent, or Firm*—Fleit & Jacobson

[57] ABSTRACT

A method of testing a field effect device for radiation hardness. The method comprises the steps of subjecting the field effect device to a low temperature environment, developing a first set of data points by measuring the conductance of the field effect device as a function of gate voltage at a first substrate bias, developing a second set of data points by measuring the conductance of the field effect device as a function of gate voltage at a second substrate bias, which is different from the first substrate bias, and comparing the first and second sets of data points to obtain an assessment of radiation hardness.

6 Claims, 3 Drawing Figures

RADIATION HARDNESS TESTING FOR FIELD EFFECT DEVICES

BACKGROUND OF THE INVENTION

1. Field of the Invention

This invention relates to semiconductor devices and relates more specifically to semiconductor field effect devices especially metal oxide silicon (MOS) transistors.

2. Description of the Prior Art

When an MOS transistor is exposed to ionising irradiation, electrons and holes are generated in the silicon oxide, holes flowing towards the silicon are trapped near the interface. This causes a change in the threshold voltage $V_T$ of the transistor. By various oxidation and annealing treatments it is possible to decrease the $V_T$ shift i.e. to radiation harden the device. However, there is still a considerable scatter in the radiation resistance to devices so treated and there is no method of determining the radiation hardness prior to irradiation. All devices have very similar pre-irradiation characteristics, although after irradiation there are wide differences in the characteristics. Thus, there is no accepted screening test for the radiation hardness of a device which does not involve irradiation. Typically where the radiation hardness of devices is important, it is usual to irradiate all the devices, and to reject those which show the largest $V_T$ shifts. The devices deemed usable are then annealed, typically at 500° C. causing the $V_T$ to return to the pre-irradiation value. The resistance of these devices however, to subsequent irradiation is reduced.

SUMMARY OF THE INVENTION

It is an object of the present invention to provide a method of testing a field effect device for radiation hardness that does not involve irradiating the device.

According to the present invention there is provided a method of testing a field effect device for radiation hardness in which conductance against gate voltage as a function of substrate bias are carried out in a low temperature environment.

DETAILED DESCRIPTION OF THE DRAWINGS

Figure 3:
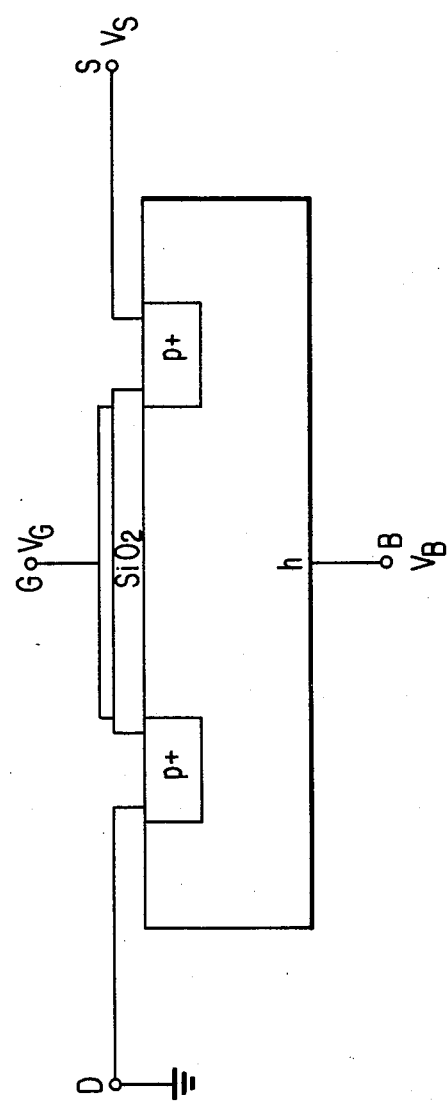
FIG. 3 shows a prior art field effect device in the form of a P-channel MOSFET with appropriate connections to measure conductance for a given gate voltage $V_G$ and a given substrate bias $V_B$.

FIG. 3 shows a prior art field effect device in the form of a P-channel MOSFET showing the appropriate connections to measure conductance for a given gate voltage and a given substrate bias. As illustrated, the drain connection is D at ground potential, which may or may not be zero volts. A suitable potential $V_S$ is applied between the source S and drain D so that, when a suitable potential $V_G$ is applied to the gate electrode G, the device connects between the source and drain. When the conductance is measured, the substrate bias $V_B$ is usually at ground potential.

In the present invention, the substrate bias $V_B$ is set at a first fixed level, which is usually zero volts, and the source-drain current is measured for different values of gate voltage $V_G$. The source-drain current allows the conductance of the device to be examined and a graph to be plotted of conductance as a function of varying gate voltage. It has been noted that the behavior of the conductance versus gate voltage characteristics, when measured at a low temperature for example, 4.2° K. changes from one value of substrate bias $V_B$ to another and that by comparing curves at different values of substrate bias, an appreciation of the hardness to radiation damage can be obtained.

In carrying out the method according to the invention, the change in threshold voltage $V_T$ as a function of a substrate bias $V_B$ may be effected at a relatively high temperature e.g. 77° K. (liquid nitrogen temperature) or at a temperature where the Fermi energy is extremely close to the majority carrier band edge and localisation effects in the inversion layer are not important. It may also be effected at a relatively low temperature e.g. at 4.2° K. (liquid helium temperature) or at a temperature typically less than approximately 50° K. The shape of the conductance against gate voltage $V_G$ characteristic is determined by this method. This characteristic should be steep e.g. to attain a conductance of $5.10^{-5} \Omega^{-1}$, $10^{12}$ carriers would be considered bad but $10^{11}$ carriers would be considered good. In addition to the above determinations the effect of substrate bias $V_B$ on the conductance against gate voltage $V_G$ characteristic can simultaneously or alternatively be derived. This effect should not be less than the corresponding shift in threshold voltage $V_T$ at said high temperature.

Substrate bias voltages $V_B$ may be applied to the device at the low temperature (e.g. 4.2° K.) possibly with light irradiation to increase response time or they may be applied at the high temperature (e.g. 77° K.) prior to cooling.

Figure 1:
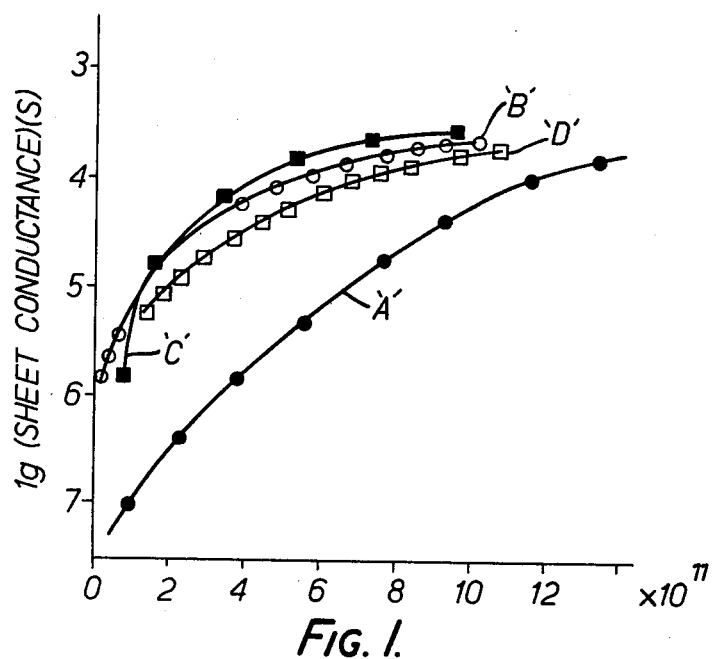
FIG. 1 shows a graphic representation of log sheet conductance versus concentration at 4.2° K. for two P-channel MOSFETS.
Figure 2:
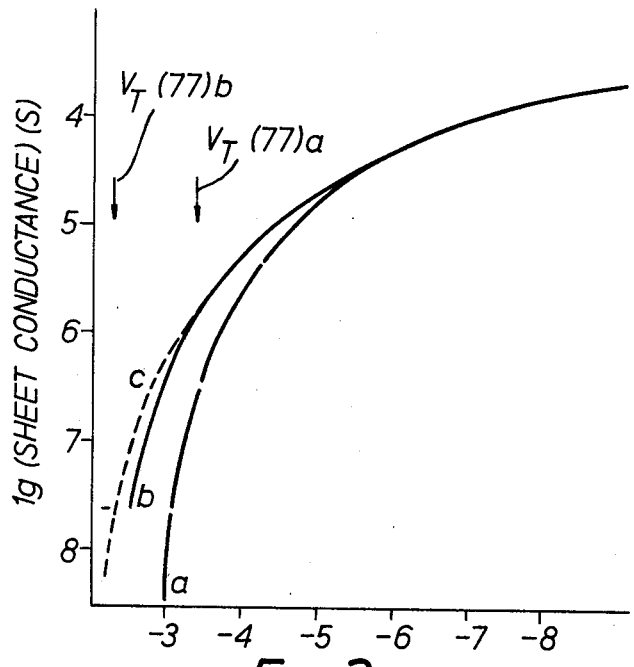
FIG. 2 shows a graphic representation of log sheet conductance-gate voltage relation of two field effect devices where device a received an irradiation dose of $10^7$ rad (Si) and device b received an irradiation dose of $5 \times 10^5$ rad (Si)

The foregoing and other features of the invention will become more apparent from the following theoretical analysis and from FIG. 1 and FIG. 2 of the accompanying drawings which show typical curves obtained by the method of the invention.

At low temperatures less than approximately 50° K. and typically ~20K, the conductance of an MOS transistor is dominated by shallow potential fluctuations at the $Si/SiO_2$ interface. These fluctuations trap, or localize, electrons in the inversion layer of an n channel device; similar effects are observed for holes in a p channel device. Conduction at low temperatures occurs by electrons jumping, or hopping, from trap to trap, a process which decreases rapidly with decreasing temperature. Recent results strongly suggest that the interfacial potential fluctuations arise from positive and negative charges, which are in the form of pairs. The separation of the charges within the pair being less than the distance between the pairs. In addition to the pairs there are a smaller number of discrete positive and negative charges. In a normal commercial device there are $\sim 10^{11}$ net positive charges at the $Si/SiO_2$ interface, although the total charge may be up to a factor of 20 greater than this.

A particularly striking effect is found when the low temperature conductance is measured as a function of carrier concentration, for various values of substrate bias $V_B$. The bias is normally applied to change the threshold voltage $V_T$ of the device, however, in this context the principal effect is to vary the distance between the centre of the charge distribution in the inversion layer and the Si/SiO$_2$ interface. It is found that pushing carriers closer to the interface results in less trapping; which is surprising, since, one's initial thought would be that as the carriers approach the interface they feel the potential fluctuations more strongly and are more easily trapped. However, if the charges are in the form of pairs with a random orientation, then, as carriers are pushed closer to the interface the fluctuations become deeper but also narrower and more numerous. The net result is for the energy of a trapped electron (or hole) to increase and de-localization occurs. This effect is not present when the net charge is high, due to the incorporation of impurities into the SiO$_2$; now the potential fluctuations are not dipolar and change very little as the carriers move closer to the interface.

Recent measurements on the effect of substrate bias $V_B$ on the 4.2° K. conductance—carrier concentration relation, using devices fabricated with a known radiation hard process, have indicated that the localization of holes in p channel devices were less than that of electrons in n channel devices. Furthermore, the effect of pushing carriers closer to the surface was to slightly increase the extent of the carrier localization. These results are all consistent with the absence of the pairs, which are responsible for the trapping of holes during irradiation, and most of the carrier localization at low temperatures. However, the importance of the result is independent of the validity of the theory, for the first time an experimental technique is available which distinguishes between hard and soft devices. The differences in the substrate bias $V_B$ effect are so strong that the technique will probably be sufficiently sensitive to discriminate between devices prepared with nominally the same process. This method of screening may be applicable for devices which are used in highly specialized pieces of equipment, where individual testing is a necessity, and affords considerable advantages over the present procedure of irradiating, then annealing out the damage.

FIG. 1 of the drawings shows curves of log sheet conductance versus concentration at 4.2° K. for two p channel MOSFETS one 'hard' and one 'soft', fabricated on the (100) surface. Curves 'A' and 'B' which are respectively concerned with 'soft' and 'hard' devices, are in respect to zero substrate bias $V_B$. Curves 'C' and 'D' which are respectively concerned with 'soft' and 'hard' devices, illustrate the effects when a reverse bias is applied to the substrate thereby causing holes to be pushed towards the Si/SiO$_2$ interface. The results shown in FIG. 1 implies that the form of potential fluctuations is not changing significantly as the holes are pushed towards the interface. This is consistent with the absence of the dipoles, the total charge being considerably less than that at 'soft' interfaces. If the negative centres are responsible for the hole trapping which occurs on irradiation then an immediate explanation of the radiation hardness is suggested. The reduction in the total number of positive and negative centres is responsible for both the absence of the previously found substrate bias effect and the absence of hole trapping as a result of irradiation.

The low-temperature conductance of irradiated devices has been investigated. FIG. 2 shows the conductance-gate voltage relation of two devices, a and b, at 4.2° K.; device b received a dose of $5 \times 10^5$ rad (Si) and device a received $10^7$ rad (Si). The threshold voltages $V_T$ of the devices at 77° K. are indicated and differ by 1.1 V ($3.4 \times 10^{11}$ charges cm$^{-2}$) principally due to trapped, radiation induced holes at the Si/SiO$_2$ interface. At 4.2° K. the conductance of the two devices is identical for high values of carrier concentration. The principal difference is at low values of carrier concentration (and conductance) when the Fermi energy is in the tail of localized states. The effect of temperature and gate bias on device b was investigated, a field of $1.4 \times 10^6$ V cm$^{-1}$ was applied across the SiO$_2$, with gate positive, and the device was cooled from above room temperature. The conductance following this treatment is c in FIG. 2; as can be seen, the conductance deep in the tail is increased. Measurements at 77° K. showed no difference due to this treatment; the effect was reversible, by repeating the process with gate negative, the conductance curve could be brought close to b.

These results give support to the basic contention that negative centers within the SiO$_2$ close to the interface are responsible for the hole trapping which occurs on irradiation. Holes produced by the radiation are trapped by these negative centres and reduce the subsequent localization of inversion layer holes. The difference between a and b shows that every trapped hole has removed a localized state. Thus, although the voltage to bend the bands and form the inversion layer is greater for a than b, the decrease in the concentration of localized states results in little difference in the voltage dependence of device conductance at higher values of gate voltage $V_G$. Applying the bias to device b above room temperature resulted in the distribution of trapped holes moving closer to the interface, so reducing the number of localized states deep in the tail c. Because the space charge of trapped holes is always close to the Si/SiO$_2$ interface, the biasing has no effect on the 77° K. conductance; this would only occur if the trapped space charge moved such a large distance in the SiO$_2$ that the total charge was no longer reflected at the Si/SiO$_2$ interface.

What I claim is:

1. A method of testing a field effect device for radiation hardness comprising the steps of:
    subjecting the field effect device to a low temperature environment;
    developing a first set of data points by measuring the conductance of the field effect device as a function of gate voltage at a first substrate bias;
    developing a second set of data points by measuring the conductance of the field effect device as a function of gate voltage at a second substrate bias, which is different from said first substrate bias; and
    comparing said first and second sets of data points to attain an assessment of radiation hardness.

2. A method as claimed in claim 1, in which the temperature of said environment is approximately 77° K.

3. A method as claimed in claim 1, in which the measurement is effected at a temperature where the Fermi energy is extremely close to the majority carrier band edge and localization effects in the inversion layer are not important.

4. A method as claimed in claim 1, in which the temperature of said environment is typically less than approximately 50° K.

5. A method as claimed in claim 1, in which the temperature of said environment is approximately 4.2° K.

6. A method as claimed in claim 5, further including the step of light-irradiating said field effect device in order to increase response time.

* * * * *